United States Patent [19]
Ogura et al.

[11] Patent Number: 4,798,794
[45] Date of Patent: Jan. 17, 1989

[54] METHOD FOR MANUFACTURING DYNAMIC MEMORY CELL

[75] Inventors: Mitsugi Ogura; Fujio Masuoka, both of Yokohama, Japan

[73] Assignee: Kabushiki Kaisha Toshiba, Kawasaki, Japan

[21] Appl. No.: 56,726

[22] Filed: Jun. 2, 1987

Related U.S. Application Data

[62] Division of Ser. No. 741,150, Jun. 4, 1985, Pat. No. 4,688,064.

[30] Foreign Application Priority Data

Jun. 5, 1984 [JP] Japan .................. 59-114912
Jun. 5, 1984 [JP] Japan .................. 59-114913

[51] Int. Cl.$^4$ .......................................... H01L 29/96
[52] U.S. Cl. .................................. 437/41; 437/47; 437/52; 148/DIG. 18
[58] Field of Search ................... 437/47, 52, 41; 357/23.6; 148/DIG. 18

[56] References Cited

U.S. PATENT DOCUMENTS

| | | | |
|---|---|---|---|
| 4,538,166 | 8/1985 | Nakano | 357/23.6 |
| 4,577,395 | 3/1986 | Shibata | 357/23.6 |
| 4,704,368 | 11/1987 | Goth et al. | 437/60 |

FOREIGN PATENT DOCUMENTS

| | | | |
|---|---|---|---|
| 0032030 | 7/1981 | European Pat. Off. | |
| 0085988 | 8/1983 | European Pat. Off. | 437/52 |
| 158472 | 12/1981 | Japan . | |
| 25985 | 6/1982 | Japan . | |
| 12739 | 3/1983 | Japan . | |
| 0175448 | 9/1985 | Japan | 357/23.6 |
| 0084053 | 4/1986 | Japan | 357/23.6 |

OTHER PUBLICATIONS

IBM Technical Disclosure Bulletin, vol. 22, No. 11, Apr. 1980, pp. 4929–4930, Armonk, N.Y., U.S.; T. S. Chang, et al., "Dynamic Random-Access Memory Cell Employing V-Groove Connection to Buried N+ Layer and Optional Capacitor".

Patent Abstracts of Japan, vol. 6, No. 42 (E-98) [920], Mar. 16, 1982; JP-A-56 158 472 (Mitsubishi Denki) 7/81.

*Primary Examiner*—Olik Chaudhuri
*Attorney, Agent, or Firm*—Finnegan, Henderson, Farabow, Garrett, & Dunner

[57] ABSTRACT

A first semiconductor layer of a P+type is formed on a semiconductor substrate of a P−type and a mask layer is formed on a portion of the first semiconductor layer other than that area where a capacitor is to be formed. A hole is formed in a direction of a thickness of the first semiconductor layer, using the mask layer. An N+ is formed on the inner surface of the hole with the mask layer as a mask. An insulating film for capacitor formation is formed on the inner surface of the resultant hole and on that atea of the first semiconductor layer where the resultant dynamic memory cell is electrically separated from an adjacent dynamic memory cell. A conductive layer acting as a capacitor electrode is formed on the capacitor formation insulating film. With the conductive layer as a mask, an impurity of an N type is doped into the first semiconductor layer to form a second semiconductor layer of a P−type in the surface portion of the first semiconductor layer. A MOS transistor is formed in the surface portion of the second conductive layer.

10 Claims, 6 Drawing Sheets

F I G. 5A
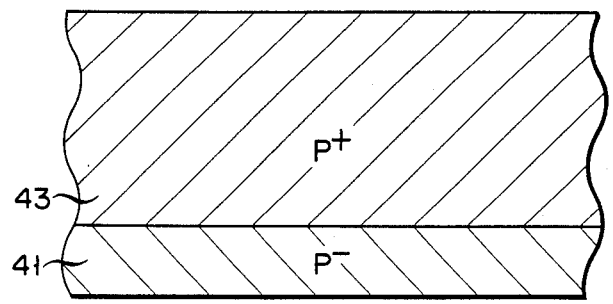
F I G. 5B
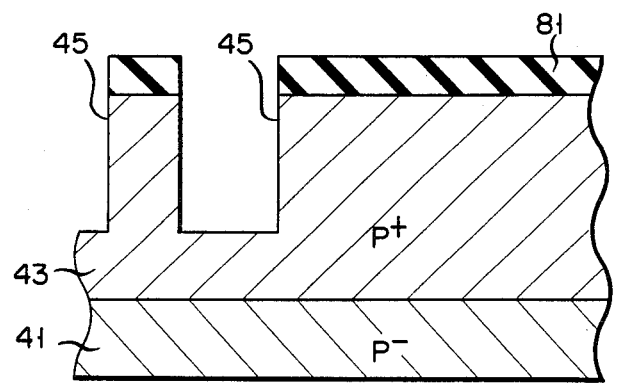
F I G. 5C
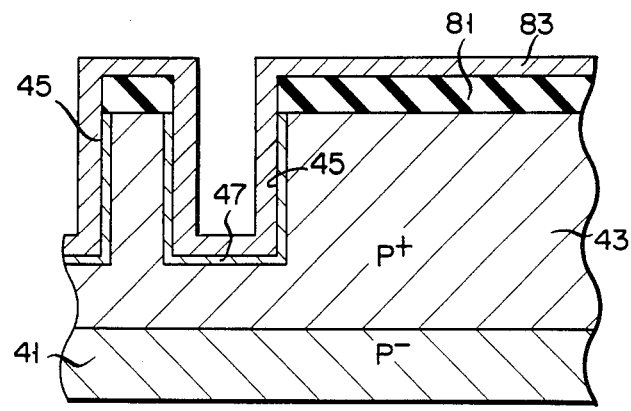

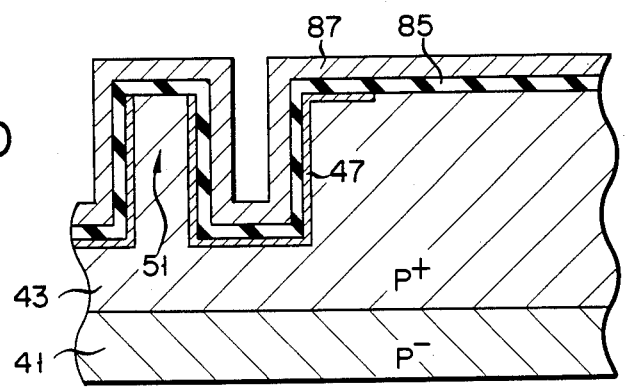
F I G. 5D
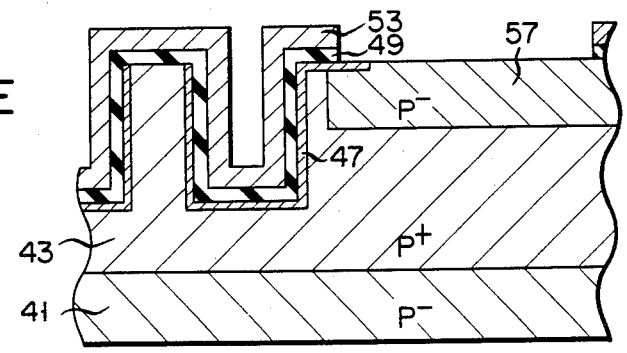
F I G. 5E
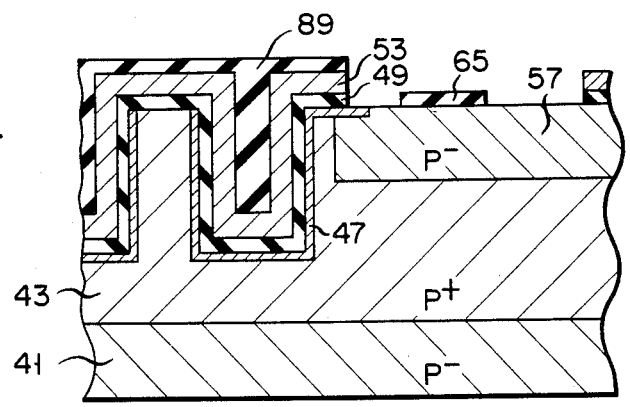
F I G. 5F

METHOD FOR MANUFACTURING DYNAMIC MEMORY CELL

This is a division of application Ser. No. 741,150, filed June 4, 1985, now U.S. Pat. No. 4,688,064.

BACKGROUND OF THE INVENTION

This invention relates to an improved memory cell of a dynamic type and, in particular, an improved dynamic memory cell which is highly integrated.

The incessant advance of semiconductor memory devices permits the highest integration density to be attained in the memory cells of ROMs. For example, a dynamic RAM of 256 K bits has been reduced to practice. In the research stage, a dynamic RAM of a 1 M bit class is being reported. Also. known is a CCC-structured dynamic RAM, a particular type of a dynamic RAM. A dynamic RAM of 1 M bit using the CCC-structured memory cells was reported at the ISSCC in 1984.

A memory cell of a CCC structure will now be explained below referring to FIG. 1.

In FIG. 1, holes are formed in a major surface portion of a P type semiconductor substrate 11 and a high concentration layer 13 of an N+ type is formed on the surface of the hole. A high concentration layer 15 of the N+ type, which acts as a source or a drain of a transistor, is formed in the major surface portion of the substrate such that it is located adjacent to the high concentration layer 13 of the N+ type. A high concentration layer 17 of an N+ type, which serves as a drain or a source, is formed in the major surface portion of the substrate such that it is located opposite to the high concentration layer 15. A P type region 19 between the N+ type regions 15 and 17 acts as a gate. The N+ type region 17 is formed integral with the drain or the source of an adjacent memory cell. A capacitor formation oxide film 21 is formed on the inner surface of the N+ layer 13.

A field oxide film 23 is formed between one capacitor formation hole and an adjacent capacitor formation hole, noting that the film 23 is so formed as to separate the one capacitor formation hole from the adjacent capacitor formation hole, that is, to separate one capacitor from an adjacent capacitor. A high concentration layer 37 of the P+ type is formed below the field oxide film 23 to prevent an inversion. A gate oxide film 25 and gate electrode 27 are formed in this order on the P type area 19. The hole is filled with a polycrystalline silicon to provide a polycrystalline silicon layer 29. The polycrystalline silicon layer 29 provides a capacitor electrode. An insulating oxide film 31 is formed on the surface of the resultant structure, i.e., on the polysilicon layer 29, gate electrode 27, etc. An aluminum interconnection layer 33 is formed on the oxide film 31 so that it is electrically in contact with the N+ layer 17. The aluminum interconnection layer 33 serves as a bit line. The capacitor is formed at an area indicated by C in FIG. 1 to constitute one portion of a memory cell.

A transistor constituting the major portion of the memory cell is formed at that area defined by a symbol TR in FIG. 1. In this CCC-structured memory cell, the capacitance of the capacitor can be increased without exerting any adverse influence over the size of the memory cell, by adjusting the depth of the hole.

In order to obtain such a memory cell with high integration density, the width of the field oxide film 23, bit line 33 and electrode 27, as well as the interval of these adjacent elements, must be made smaller. The minimum dimension of these elements is determined by the resolution of mask alignment in the manufacture of LSIs.

In order to further enhance the integration density of the memory cell, it is necessary to make the interval between one hole and the adjacent hole equal to the width of the field oxide film 23. Thus, these holes must be formed in a self-aligned fashion to the field oxide film 23 in an attempt to form these holes in close proximity. If any mask alignment is required, then it is necessary that such holes be formed on both the sides of the field oxide film 23 with a mask alignment allowance since the hole-to-hole interval cannot be decreased down to the width of the field oxide film.

Where the hole 35 is to be formed in a self-aligned fashion to the field oxide film 23 as shown in a partially enlarged cross-section in FIG. 2, the following drawbacks are encountered.

FIG. 2 is a view for explaining the neighborhood of the N+ type layer 13 with the unimportant portion omitted for clarity. The N+ type layer 13 becomes much thinner in the neighborhood of the field oxide film 23. When the hole is to be formed utilizing an RIE (Reactive Ion Etching) device, etc., radiation damage occurs to the N+ layer 13. Furthermore, an overhang occurs below the field oxide film 23. Upon the occurrence of these phenomena, a greater leakage current flows due to the presence of the capacitor in the memory cell, thus degenerating the storage characteristic of the memory cell. It has been impossible to decrease by much the thickness of the field oxide film 23, because a possible inversion may occur in the conductivity type of the surface portion of the semiconductor substrate.

The high integration density of the memory cell and the consequent narrowing of a capacitor-to-capacitor interval cause a larger leakage current to flow between the memory cells. In particular, the depletion layers of the capacitors extend below the field oxide film 23, tending to produce a punch-through phenomenon due to the coupling of the depletion region between the adjacent memory cells. When such punch-through phenomenon occurs, then an interference occurs between the adjacent memory cells, causing a possible destruction of storage data.

SUMMARY OF THE INVENTION

It is accordingly the object of this invention to provide a dynamic memory cell having excellent characteristics which is suited to high integration density.

Additional objects and advantages of the invention will be set forth in part in the description which follows, and in part will be obvious from the description, or may be learned by practice of the invention. The objects and advantages of the invention may be realized and attained by means of the processes and combinations particularly pointed out in the appended claims.

To achieve the objects and in accordance with the purpose of the invention, as embodied and broadly described herein, there is provided a method for manufacturing a dynamic memory cell comprising the steps of:

forming a first semiconductor layer of a first conductivity type on a semiconductor substrate of the first conductivity type, the first semiconductor layer having an impurity concentration higher than that of said semiconductor substrate;

forming on a major surface portion of the first semiconductor layer a mask for forming at least one capacitor formation hole;

forming by use of the mask a hole in the major surface portion of the first semiconductor layer;

forming a second semiconductor layer of a second conductivity type on the inner surface of the hole using as a mask the mask used for hole formation;

forming a capacitor formation insulating film on said second semiconductor layer and forming a cell insulating film on a separation area of said first semiconductor layer that insulates electrically the dynamic memory cell, the thickness of said cell insulating film being equal to or smaller than the thickness of said capacitor formation insulating film;

forming a capacitor electrode on the capacitor formation insulating film; and forming a MOS transistor in the first semiconductor layer.

The dynamic memory cell and method for manufacturing the same have the following advantages:

(a) A memory cell is separated by a high impurity concentration area of a first conductivity type from an adjacent memory cell, obviating the necessity of providing any field oxide film. As a result, the cell-to-cell separation and capacitor-to-capacitor separation can be achieved by the above-mentioned thin separation insulating layer.

(b) As set out above, in the prior art, a complex and time-consuming step is required in the formation of a narrower, thicker oxide film. According to this invention the manufacture of the dynamic memory cell is easier to accomplish by its respective steps than in the conventional method.

(c) No overhang occurs in forming a capacitor formation hole due to the absence of any field oxide film, thus improving the characteristic of the capacitor in each memory cell over that of the conventional counterpart. It is therefore possible to obtain a memory cell having an improved data retention characteristic.

(d) Since no allowance is required on both sides of the field oxide film due to the absence of any field oxide film, an interval between the capacitor formation holes can be set within the limit resolution of the mask aligner, assuring a dynamic memory device which has a higher integration density over that of the conventional counterpart.

The accompanying drawings, which are incorporated in and constitute a part of this specification, illustrate embodiments of the invention and, together with the description, serve to explain the principles of the invention.

BRIEF DESCRIPTION OF THE DRAWINGS

FIGS. 5A through 5H are cross-elevation views for explaining a method for manufacturing the dynamic memory cell shown in FIGS. 3 and 4;

DETAILED DESCRIPTION OF THE PREFERRED EMBODIMENTS

A dynamic memory cell according to one embodiment of this invention will now be explained below by referring to FIGS. 3, 4 and 5A to 5H.

First, the arrangement of the dynamic memory cell according to said one embodiment of this invention will be explained below by referring to FIGS. 3 and 4.

Figure 3:
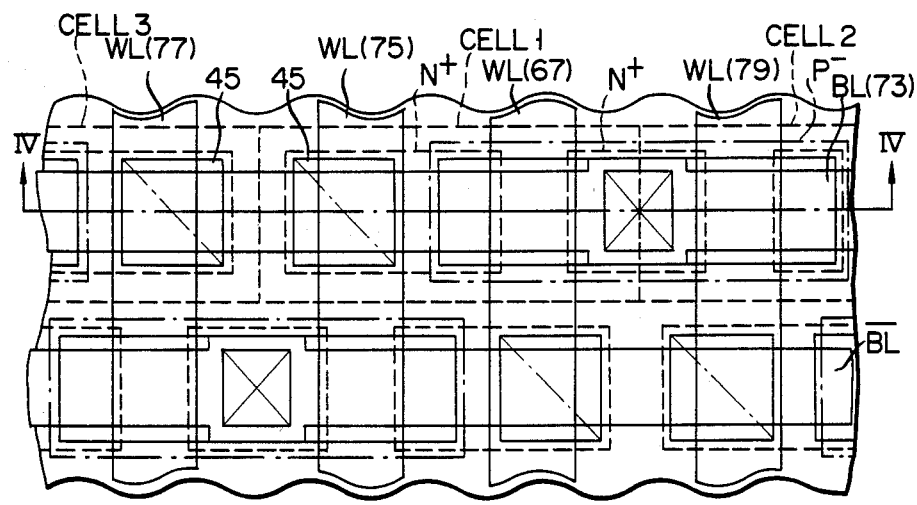
FIG. 3 is a plan view showing a dynamic memory cell constructed according to one embodiment of this invention.

FIG. 3 is a plan view for explaining a positional relation of each part of the memory cells with the unimportant portions omitted. In FIG. 3, a bit line BL is shown together with a bit line "BL" for transmitting an inverted replica of a signal which is transmitted over the bit line BL. Also shown in FIG. 3 are four word lines as well as six memory cells. FIG. 4 shows memory cells 1, 2 and 3, each constituted of a MOS transistor and MOS capacitor. The corresponding two memory cells have a shared drain. In this embodiment, the memory cells 1 and 2 have a common drain.

The arrangement of the dynamic memory cell according to this embodiment will be explained below.

A high concentration semiconductor layer of a P+ type is formed on the surface of a low concentration semiconductor substrate of a P− type. In this case, for example, boron is used as a P type impurity. The P− type substrate 41 is set to have an impurity concentration of, for example, $1 \times 10^{15}$ cm$^{-3}$ and the P+ type layer 43 is set to have an impurity concentration of $1 \times 10^{16}$ cm$^{-3}$. Capacitor formation holes 45 are formed which extend from the surface of the P+ layer 43 into the interior of the P+ layer 43. In this connection it is to be noted that the holes 45 are formed to have a square configuration in a plan view in FIG. 3. The depth of the hole 45 is properly set by, for example, the capacitance of a capacitor to be formed.

A high concentration layer 47 of an N+ type is formed on the surface of the hole 45 and the N+ layer 47 is formed to have, for example, 0.2 μm in depth and an impurity concentration of $1 \times 10^{17}$ to $1 \times 10^{18}$ cm$^{-3}$. The N+ layer 47 operates as one electrode of the capacitor in the memory cell, noting that the threshold voltage of the MOS capacitor is at a negative level. The N+ layer 47, together with the P+ layer 43, forms a capacitance on the PN junction. An insulating film 49, such as SiO$_2$, is formed on the inner surface of the N+ layer 47 and on a separation area present between the adjacent capacitors of the semiconductor layer 43, thus electrically separating the capacitor from the adjacent capacitor. As seen from FIG. 4, the insulating film 49 is formed on a separation area 51 whereby the capacitor of the first memory cell 1 is electrically separated from the capacitor of the third memory cell 3. The insulating film 49 has a thickness of, for example, 10 nm. A first polycrystalline silicon layer 53 is formed on the insulating film 49 and acts as one of the electrodes of the capacitor. The silicon layer 53 extends (not shown), and is supplied at a proper location with, for example, a ground potential.

A low concentration layer 57 of a P− type is formed in the surface area of a transistor formation area TR1 of the P+ layer 43, noting that the P− layer 57 has an impurity concentration of, for example, $5 \times 10^{15}$ cm$^{-3}$ and that the P− layer 57 is formed, for example, with a thickness 1 μm from the surface of the P+ layer 43. The P− layer 57 is formed at an area indicated by a dash dot line in plan view in FIG. 3. A high concentration layer 59 of an N+ type is formed in the surface area of the P− layer 57 such that it is in contact with the N+ layer 47. The N+ layer 59 acts as the source or the drain of the transistor. A high concentration layer 63 of an N+ type is formed in the surface portion of the P− layer 57 with a predetermined interval left relative to the N+ layer 59, that is, with the P− layer 61 left relative to the N+ layer 59. The P− layer 61 between the N+ layers 59 and 63 works as the gate of the transistor and the N+ layer 63 acts as the drain or the source of the transistor. The N+ regions 47, 59 and 63 are formed in the area indicated by the broken line in plan view in FIG. 3.

A gate insulating layer 65 is formed on the P− area 61 such that it has a thickness greater than the thickness (for example, 10 nm) of the insulating layer 49. A second polycrystalline silicon layer 67 is formed on the insulating layer 65 and works as a gate electrode. The second polysilicon layer 67 extends such that it is formed integral with the gate of the corresponding other memory cells. The polycrystalline silicon layer 67 acts as the word line WL. An insulating layer 69 is formed on the surface of the resultant structure, noting that, at this time, the hole area is filled with the layer 69. A contact hole 71 is formed in that area of the insulating layer 69 where the layer 69 overlies the N+ layer 63. An aluminum layer 73 is formed on the insulating layer 69 and serves as a bit line, noting that the aluminum layer 73 is in contact with the N+ layer 63 through the contact hole 71. The word lines 75, 77 and 79 are formed for the memory cells other than the memory cell 1. A passivation film for device protection (not shown), is normally formed on the surface of the resultant semiconductor device.

The transistor of the memory cell so obtained comprises the N+ layer 59 working as the source or the drain, P− area 61 working as the gate, N+ layer 63 acting as the drain or the source, oxide film 65 acting as gate oxide film and polycrystalline silicon layer 67 acting as the gate electrode.

The capacitor of the memory cell comprises a capacitance on the PN junction between the N+ layer 47 and the P+ layer 43 and a capacitance between the N+ layer 47 and the first polycrystalline silicon layer 53.

The adjacent capacitors, for example, the capacitors of the memory cells 1 and 3, are electrically separated from each other at a portion of the P+ layer 43, that is, at the separation area 51. A thin oxide film 49, unlike the conventional field oxide film, is formed on the separation area 51. The thin oxide film 49 is formed to have a thickness substantially equal to, and smaller than, that of the gate oxide film 65.

A method of manufacturing the above-mentioned memory cell will be explained below by referring to FIGS. 5A to 5H. For explanation, the memory cell 1 will be explained below by way of example.

As shown in FIG. 5A, a high concentration semiconductor layer 43 of a P+ type is formed on the surface of a semiconductor substrate 41 of a P− type. A photoresist film 81 of silicon nitride (SiN) is formed on the P+ semiconductor layer 43. In order to form hole 45 for capacitor formation, the photoresist film 81 on the hole formation area is removed by, for example, a photo-etching process. Then, as shown in FIG. 5B, the hole 45 is formed by, for example, a reactive ion etching (RIE) step. The shape, depth, etc. of the hole 45 are properly set, depending upon the etching conditions.

A polycrystalline silicon layer 83 doped with an N type impurity, such as As, is formed on the surface of the resultant structure. The silicon layer 83 is heated to cause the N type impurity in the polycrystalline silicon layer 83 to be diffused in the semiconductor layer 43 to form a high concentration layer 47 of an N+ type in the side and bottom surfaces of the hole 45 as shown in FIG. 5C.

The photoresist film 81 and polysilicon layer 83 are wholly removed. To permit a connection to be made between the N+ layer 47 and an N+ layer 59 to be later formed as one region of a transistor, an N type impurity, such as As, is selectively ion implanted into the P+ layer 43, thereby permitting the N+ layer 47 to extend along the surface area of the P+ layer 43. An insulating layer 85 is formed on the whole surface of the resultant structure such that it has a thickness of about 10 nm. The insulating layer 85 is, for example, an SiO$_2$ layer and is formed by a thermal oxidation step and a polycrystalline silicon layer 87 is formed, by a deposition method for instance, on the surface of the insulating layer 85 as shown in FIG. 5D.

The silicon layer 87 and insulating layer 85 are selectively removed over a transistor formation area TR1, leaving the insulating film 49 and first silicon layer 53. That is, an electrostatic shielding plate is formed for capacitors and for element separation. Then, an N type impurity, such as As or P, is ion implanted into the semiconductor layer 43 with the insulating layer 49 and silicon layer 53 as a mask, noting that the ion is implanted with a relatively greater thickness of, for example, 0.8 to 1 μm. In this way, the surface portion of the P+ layer 43 is compensated with the N type impurity to form a low concentration layer 57 of a P− type as shown in FIG. 5E. That is, the P− layer 57 is formed in a self-aligned relation to the polycrystalline silicon layer 53.

Then, the surface of the resultant structure is thermally oxidized to form an oxide film on the silicon layer 53 and P− layer 57. As shown in FIG. 5F, the oxide film is photo-etched to form a gate oxide film 65 on a gate formation area of a transistor in the memory cell. An oxide film 89 (a portion of an oxide film 69) is formed on the silicon layer 53.

Figure 5G:
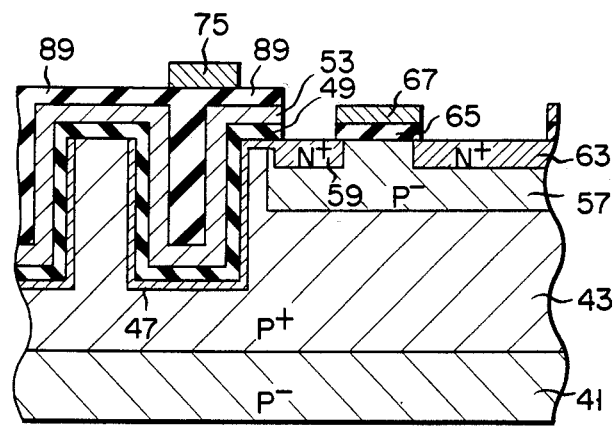

Then, a polycrystalline silicon layer is formed on the whole surface of the resultant structure by, for example, a deposition method. The polycrystalline silicon layer is photo-etched to form a second polycrystalline silicon layer (gate electrode) 67 on the gate formation area as shown in FIG. 5G. In this connection it is to be noted that the gate electrode 67 extends as set out above. In FIG. 5G is shown a gate electrode 75 of another memory cell.

Figure 5H:
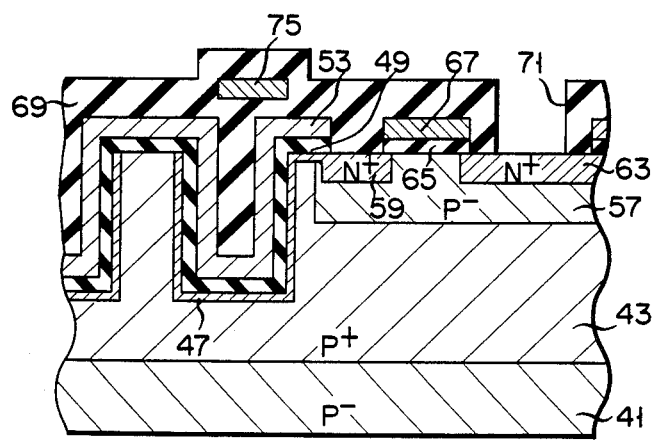

An N type impurity is diffused into the P− layer 57 with the gate electrode 67, insulating layer 89, etc. as masks. This step may be effected such that, after forming, for example, an N type impurity-bearing polycrystalline silicon layer, the impurity in the polycrystalline silicon layer is thermally diffused. In this case, the N type impurity may be ion implanted. As a result, N+ layers 59 and 63, each of which act as the source or the drain, are formed in a self-aligned relation to the gate electrode 67, noting that the N+ layer 63 is formed integral with the N+ layer which serves as the source or the drain of the adjacent memory cell as set out above. The N+ layer 59 is connected to the N+ layer 47 as set out above. Then, a relatively thicker insulating film, for example an $SiO_2$, is formed by, for example, a deposition method on the whole surface of the resultant structure to form an insulating film 69. A contact hole 71 is formed in the insulating layer 69 over a portion of the N+ layer 63, as shown in FIG. 5H. Then, an aluminum interconnection layer 73 is formed on the surface of the resultant structure. The interconnection layer 73 is formed in contact with the N+ layer 63 through the contact hole 71. The interconnection layer 73 extends as set out above and operates as a bit line BL. Then, a passivation film (not shown) is formed on the whole surface of the resultant structure so as to protect the memory device.

Figure 4:
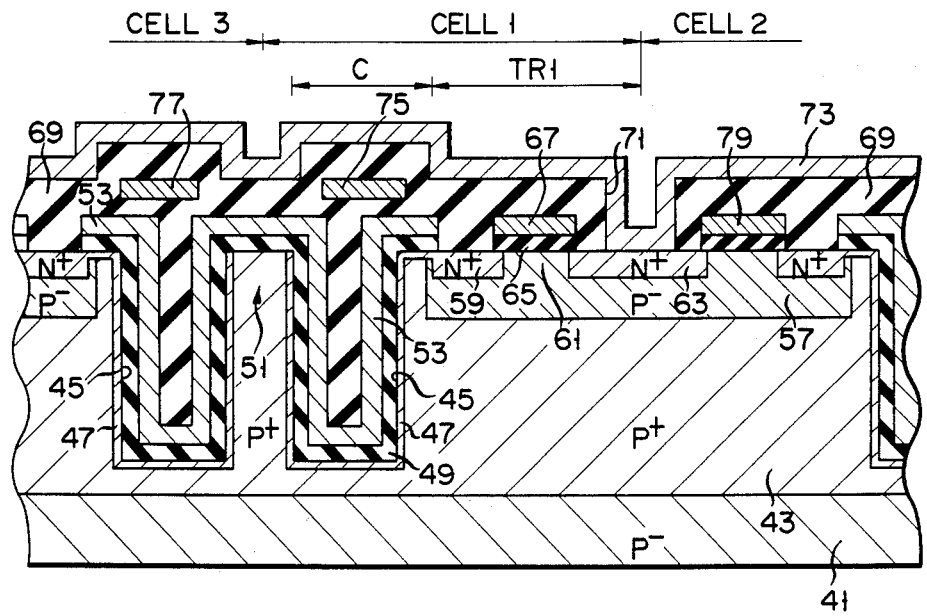
FIG. 4 is a cross-sectional view, taken along line IV—IV in FIG. 3, showing a dynamic memory cell in elevation.

In this way, the dynamic memory device as set out in FIGS. 3 and 4 is obtained.

Figure 1:
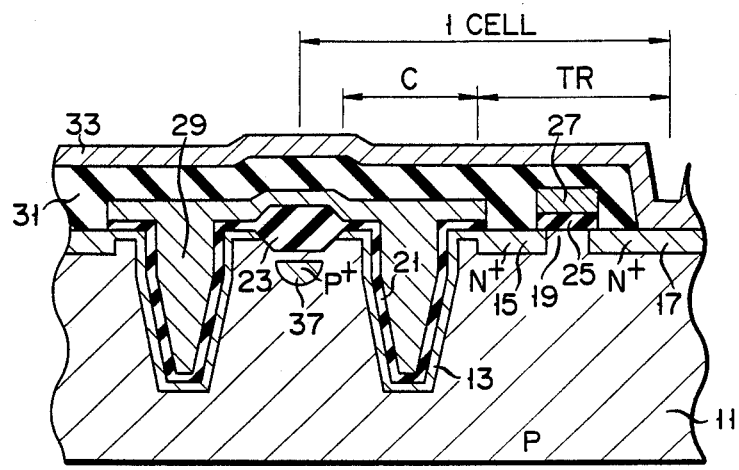
FIG. 1 is a cross-sectional view showing one form of a conventional dynamic memory cell.
Figure 2:
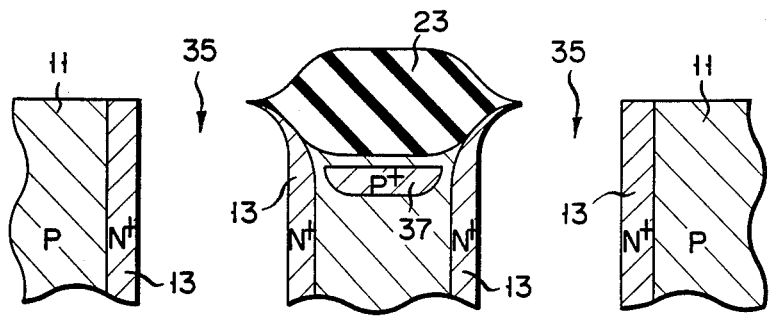
FIG. 2 is an enlarged, cross-sectional view showing the neighborhood of a field oxide film for explaining the drawback of the conventional dynamic memory cell of FIG. 1.

The dynamic memory cell and the method for manufacturing the same have the following advantages:

(1) Since the cell is separated by the P+ area 51 from the adjacent cell, it is not necessary to provide a field oxide film for cell to cell separation as disclosed in FIG. 2. Furthermore, it is possible to effect a separation between the cells and between the capacitors even in the presence of a thin oxide film whose thickness is equal to, or smaller than, that of the gate insulating film 65, or equal to that of the insulating film forming MOS capacitor. A complex and time-consuming step is required, as set out above, in forming a narrower, thicker oxide film. According to this invention, it is very easy to form the insulating film as compared with the conventional manufacturing steps.

(2) No overhang occurs in the formation of the capacitor formation hole 45, because it is not necessary to provide any field oxide film. For this reason, the characteristic of the capacitor is improved over that for the conventional element, making it possible to provide a memory cell having a better data retainability.

(3) The absence of the field oxide film obviates the need of providing any allowance on both sides of the field oxide film. Therefore, the interval of the capacitor formation holes can be set within the limit of the resolution of the mask aligner. This feature assures a high-density, dynamic memory device as compared with the conventional memory device. That is, a memory device of a greater capacity can be manufactured with a chip size equal to a conventional counterpart, lowering the memory cost.

(4) The memory cell is formed within the P+ layer 43, enhancing the reliability with which it operates. A very small crystal disturbance is present in the silicon substrate, normally providing a source for the generation of minority carriers. The minority carriers migrate in the substrate and, after being trapped in the memory cell, are recombined with holes in the memory cell. The same phenomenon also occurs when the minority carriers are generated due to high energy particles (α ray) from the IC package, etc. In the former case a hard error appears in connection with the retention characteristic, whereas in the latter case a temporary failure appears as a soft error. In order to prevent the occurrence of such errors, it is only necessary to increase a probability of a recombination of these minority carriers with the majority carriers. According to this invention, a greater resistance can be assured against these defects, because the memory cell is formed on the P+ layer 43.

(5) The P+ separation area 51 (a portion of the P+ semiconductor layer 43) exists between the capacitor formation holes 45. For this reason, the depletion region does not extend toward the neighborhood of the capacitor and thus no data interference (punch-through) occurs between the memory cells (between the capacitor). Since, therefore, the depletion region does not extend toward the adjacent memory cell as has been encountered in the prior art semiconductor device, a greater capacitance is obtained on the PN junction of the N+ layer 47 and the P+ layer 43, thus enabling the capacitor in the memory cell to have a greater capacitance.

(6) Since the N type impurity is doped, in a self-aligned fashion, into the P+ layer 43 through the hole of the first polycrystalline silicon layer 53, the transistor formation portion and contact formation portion are brought back to the lower concentration level. For this reason, the gate area 61 of the transistor is also made at the low concentration level, preventing the threshold voltage of the switching transistor in the memory cell from reaching an excess level. It is also possible to decrease the capacitance on the PN junction in the contact formation portion and thus largely decrease the floating capacitance on the bit line BL. That is, the capacitance on the junction with the contact formation portion can be made about one-tenth the capacitance which may otherwise be produced on the junction between the high concentration layers of N+ and P+ types due to the absence of the P− layer 57. This specific arrangement reduces power as dissipated due to a charge and discharge on the bit line BL and thus improves the operation speed of the memory cell. Since, in particular, the bit line is shared among a plurality of memory cells, the overall capacitance is greatly reduced.

Figure 6:
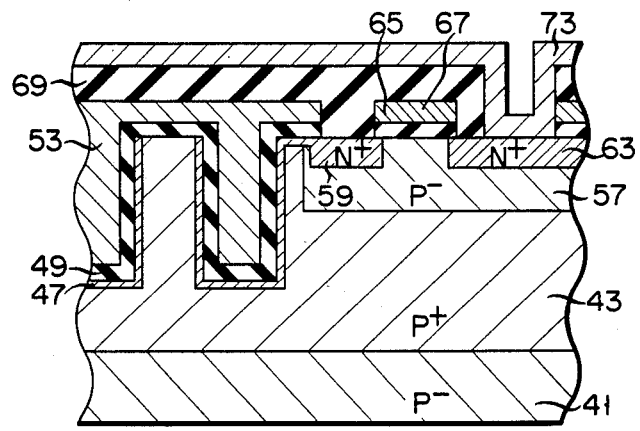
FIG. 6 is a cross-sectional view in elevation showing an arrangement of a dynamic memory cell constructed according to another embodiment of this invention.

This invention is not restricted to the above-mentioned embodiment. Although the silicon oxide film is used as the insulating film 49 for the capacitor, this invention is not restricted to the use of the silicon oxide film. For example, use may be made, as the insulating film, of silicon nitride or a double $SiN-SiO_2$ layered structure. Although, in the above-mentioned embodiment, the capacitor formation hole 45 is not completely filled with the first polycrystalline silicon layer 53, it may be completely filled with the layer 53 as shown in FIG. 6.

Figure 7:
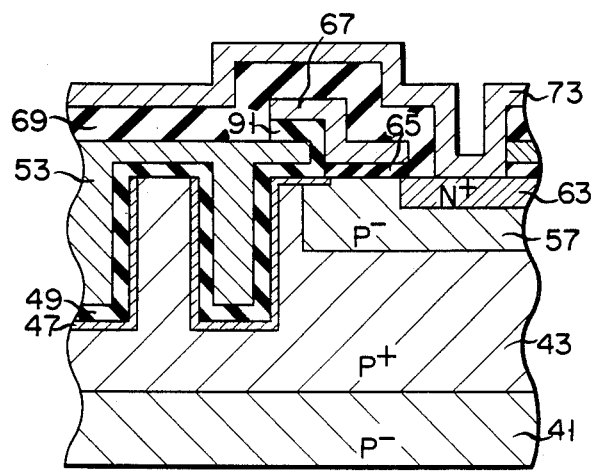
FIG. 7 is a cross-sectional view in elevation showing a dynamic memory cell constructed according to another embodiment of this invention.

As shown in FIG. 7, in place of N+ layer 59 between the capacitor C and the switching transistor TR in FIG. 4, the second polycrystalline silicon layer 67 may be so formed as to overhang the first polycrystalline silicon layer 53 with an insulating layer 91 therebetween. In this case, the channel length of the transistor is changed, depending upon the mask alignment, and a still higher integration density can be obtained if the accuracy of the mask alignment is improved.

In these embodiments, a P-channel MOS transistor may be used in place of the N-channel MOS transistor. In this case, however, the conductivity type of the semiconductor parts is reversed correspondingly.

The dimension, concentration, etc. of the semiconductor parts, though explained above by way of example, are not restricted to the above-mentioned values. For example, proper values may be used so long as the impurity concentration of the P+ layer 43 is adequate enough to effect an electrical separation between the capacitors and large enough not to reverse the conductivity type of the surface portion of the semiconductor layer 43. The concentration level of the P+ layer 43 may preferably be about $0.7 \times 10^{16}$ cm$^{-3}$ to $1.3 \times 10^{16}$ cm$^{-3}$. Similarly, a proper value may be employed as the impurity concentration level of the P− layer 57 so long as it is not too high for the threshold voltage of the MOS transistor and too large for the capacitance on the PN junction. The value may be normally within a range of about $3 \times 10^{15}$ to $7 \times 10^{15}$ cm$^{-3}$. The thickness of the insulating layer 49 is not restricted to 10 nm and may be properly selected, depending upon the impurity concentration, voltage of the memory cell and capacitance of the MOS capacitor. This value is normally within a range of about 7 to 13 nm.

Although a folded-bit line is used for the memory array in FIG. 3, an open bit line may also be valid for the memory array.

What is claimed is:

1. A method of manufacturing a dynamic memory cell, comprising the steps of:

forming a first semiconductor layer of a first conductivity type on a semiconductor substrate of the first conductivity type, the first semiconductor layer having an impurity concentration higher than that of said semiconductor substrate;

forming on a major surface portion of the first semiconductor layer a mask for forning at least one capacitor formation hole;

forming by use of the mask the hole in the major surface portion of the first semiconductor layer;

forming a second semiconductor layer of a second conductivity on the inner surface of the hole using as a mask the mask used for hole formation;

forming a capacitor formation insulating film on said second semiconductor layer and forming a cell insulating film on a separation area of said first semiconductor layer that insulates electrically the dynamic memory cell, the thickness of said cell insulating film being equal to or smaller than the thickness of said capacitor formation insulating film;

forming a capacitor electrode on the capacitor formation insulating film; and forming a MOS transistor in the first semiconductor layer.

2. A method according to claim 1, in which said MOS transistor forming step comprises the steps of:

doping an impurity of the second conductivity type in the first semiconductor layer with the capacitor electrode as a mask to form a third semiconductor layer of the first conductivity type in the first semiconductor layer, the impurity concentration of the third semiconductor layer being lower than that of the first semiconductor layer; and forming the MOS transistor in the third semiconductor layer.

3. A method according to claim 2, in which said transistor forming step comprises the steps of:

forming a gate insulating film on the third semiconductor layer, the gate insulating film being equal to, or thicker than, the capacitor formation insulating film;

forming a gate electrode on the gate insulating film;

forming one electrode layer of the second conductivity type in the third semiconductor layer in a self-aligned fashion relative to said gate electrode and the other electrode layer of the second conductivity type in the third semiconductor layer in a self-aligned fashion relative to the gate electrode apart from said one electrode layer, said one electrode layer being in contact with the second semiconductor layer.

4. A method according to claim 3, in which the impurity concentration of said first conductivity layer is $0.8 \times 10^{16}$ cm$^{-3}$ to $1.2 \times 10^{16}$ cm$^{-3}$, the impurity concentration of the second semiconductor layer is $3 \times 10^{15}$ cm$^{-3}$ to $7 \times 10^{15}$ cm$^{-3}$ and the thickness of the capacitor formation insulating film is 7 nm to 13 nm.

5. A method of manufacturing a dynamic memory cell comprising the steps of:

forming a first semiconductor layer of a first conductivity type on a semiconductor substrate of the first conductivity type, the impurity concentration of the first semiconductor layer being higher than that of the semiconductor substrate;

forming on one major surface area of the first semiconductor layer a mask for forming at least one capacitor formation hole;

forming by use of the mask the hole in the major surface of the first semiconductor layer;

forming a second semiconductor layer of a second conductivity on the inner surface of the hole using as a mask the mask used for hole formation;

forming an insulating film on the inner surface of the hole and on the separation area of the first semiconductor layer that electrically isolates the dynamic memory cell;

forming a capacitor electrode layer on the insulating film;

doping an impurity of a second conductivity type into the first semiconductor layer with the capacitor electrode layer as a mask and forming a third semiconductor layer of the first conductivity type in the surface area of the first semiconductor layer, the impurity concentration of the third semiconductor layer being lower than that of the first semiconductor layer;

forming a gate electrode such that it overlies the third semiconductor layer; and forming source and drain regions in the surface area of the third semiconductor layer in a self-aligned fashion relative to the gate electrode with the gate electrode as a mask, one of the source and drain regions being in contact with the second semiconductor layer.

6. A method according to claim 5, in which the impurity concentration of the first semiconductor layer is $0.8 \times 10^{16}$ cm$^{-3}$ to $1.2 \times 10^{16}$ cm$^{-3}$, the impurity concentration of the third semiconductor layer is $3 \times 10^{15}$ cm$^{-3}$ to $7 \times 10^{15}$ cm$^{-3}$ and the thickness of the insulating film on the hole inner surface is 7 nm to 13 nm.

7. A method according to claim 5, in which the thickness of said insulating film on the spearation area is equal to or smaller than the thickness of the insulating film on the hole inner surface.

8. A method of manufacturing a dynamic memory cell, comprising the steps of:

preparing a first semiconductor layer of a first conductivity type;

forming at least two holes in the first semiconductor layer;

forming at least two second semiconductor layers of a second conductivity type, each of which is formed on an inner surface of its corresponding hole;

forming an insulating film on said second semiconductor layers and on the separation area of the first semiconductor layer that electrically isolates the second semiconductor layers from each other;

forming a capacitor electrodes on the insulating film;

doping an impurity of the second conductivity type in the first semiconductor layer to form a third semiconductor layer of the first conductivity type in the first semiconductor layer, the impurity concentration of the third semiconductor layer being lower than that of the first semiconductor layer; and forming a MOS transistor in the third semiconductor layer.

9. A method according to claim 8, in which said transistor forming step comprises the steps of:

forming a gate insulating film on the third semiconductor layer, the gate insulating film being equal to, or thicker than, the insulating film on said second semiconductor layers;

forming a gate electrode on the gate insulating film; and forming source and drain regions of the second conductivity type in the third semiconductor layer in a self-aligned fashion relative to said gate electrode, one of said source and drain regions being in contact with the second semiconductor layer.

10. A method according to claim 8, in which the thickness of said insulating film on the separation area is equal to or smaller than the thickness of the insulating film on said second semiconductor layers.

* * * * *

UNITED STATES PATENT AND TRADEMARK OFFICE
CERTIFICATE OF CORRECTION

PATENT NO. : 4,798,794
DATED : January 17, 1989
INVENTOR(S) : Mitsugi Ogura et al.

It is certified that error appears in the above-identified patent and that said Letters Patent is hereby corrected as shown below:

In Abstract, Line 10, change "atea" to --area--.

Claim 7, Column 10, Line 54, change "spearation" to --separation--.

Signed and Sealed this

Thirteenth Day of October, 1992

Attest:

DOUGLAS B. COMER

*Attesting Officer*   *Acting Commissioner of Patents and Trademarks*